United States Patent [19]

Nokubo

[11] 4,335,449

[45] Jun. 15, 1982

[54] SEMICONDUCTOR MEMORY DEVICE

[75] Inventor: Jyoji Nokubo, Tokyo, Japan

[73] Assignee: Nippon Electric Co., Ltd., Tokyo, Japan

[21] Appl. No.: 133,999

[22] Filed: Mar. 26, 1980

[30] Foreign Application Priority Data

Mar. 26, 1979 [JP] Japan .................................. 54/3518

[51] Int. Cl.³ ............................................. G11C 11/40
[52] U.S. Cl. .................................... 365/177; 357/43; 365/182
[58] Field of Search ....................... 365/174, 177, 182; 357/43, 45

[56] References Cited

U.S. PATENT DOCUMENTS 3,284,782 11/1966 Burns ................................. 365/154
3,427,598 2/1969 Kubinec ............................. 365/154

Primary Examiner—T. Fears
Attorney, Agent, or Firm—Sughrue, Mion, Zinn, Macpeak & Seas

[57] ABSTRACT

A semiconductor memory device operable at a high speed and having a high density of integration is disclosed. The memory device comprises a memory cell array consisting essentially of insulated-gate field effect transistors and peripheral circuits including bipolar transistors with their emitters coupled in common in an ECL configuration.

10 Claims, 10 Drawing Figures

SEMICONDUCTOR MEMORY DEVICE

The present invention relates to a semiconductor memory device.

Semiconductor memory devices currently in use can in general be classified into two groups depending on the fields of application—one featuring high speed operation and the other featuring a large memory capacity. Attaining a high speed operation has inevitably resulted in large amount of power consumption, because a large power is required in memory cell arrays and peripheral circuits. In consequence, it has been difficult to obtain a large memory capacity on a semiconductor chip because of the limitations on total power consumption. Attaining a large memory capacity has sacrificed operating speed. Therefore, a semiconductor memory device operable at a high speed and having a large capacity has been hard attain.

In view of device structures and manufacturing processes, bipolar transistors have been used in high speed semiconductor memories. Because of their low impedance characteristic, bipolar transistors can operate at a very high speed. However, they consume large amounts of power, and their production yield has not been high because the manufacturing process to produce them has been complicated and lengthy. Insulated-gate field effect transistors (hereinafter referred to as IGFET) have been used in semiconductor memories featuring a large memory capacity. The manufacturing process for IGFETs is only about half as complicated and lengthy of that of bipolar transistors and has a good production yield, proving to be suitable for large capacity devices. However, the conduction resistances of IGFETs are large, and the devices are not suitable for high speed operation.

Recently, a RAM with MOS transistor construction having a high speed by virtue of bipolar transistors incorporated in part of its peripheral circuits was proposed in the 1978 IEEE International Solidstate Circuits Conference Digest of Technical Papers, Pages 110-111. The RAM uses bipolar transistors, which perform an emitter follower function, as loads for the output section of the peripheral circuits constructed with MOS transistors. Peripheral circuits of those RAMs attained a high speed to some extent. However, they did not have sufficiently high speed for the following reasons.

The peripheral circuits used inverter circuits of so-called CMOS construction as input circuits, and only input logic values at the TTL level (generally, 2-0.8 V), which have a large amplitude, could be used. For this reason, the foregoing emitter follower transistors could be operated only at the relatively slow speed of TTL circuits. As is well known, a severe limitation is placed on temperature and voltage variation coefficients for the interface level to ECLs which are known to be the fastest bipolar logic circuits. However, as the threshold voltage of a MOS transistor varies at about ±0.2 V even in the same chip in the said CMOS inverter circuit, signals of an ECL level cannot be handled simply.

It is an object of the present invention to provide a high-speed and large capacity semiconductor memory device.

It is another object of the present invention to provide a memory device operable with small power consumption.

A memory device according to the present invention comprises a memory cell array including a plurality of memory cells consisting essentially of IGFETs and peripheral circuits including emitter coupled bipolar transistors constituting emitter coupled logic circuits.

The present invention permits the realization of low power consumption and high integration by making memory cells with IGFETs. According to the present invention, peripheral circuits such as selection circuits for selecting the memory cells in the memory cell array, read and write control circuits, sense amplifier circuits, and other function circuits, which substantially employ bipolar transistors, can operate at high-speeds. IGFETs may be mixed in making the peripheral circuits depending on the necessity. Thus, the advantages of IGFETs and bipolar transistors are demonstrated to the maximum.

According to the present invention, IGFETs used in the memory cells can also reduce the power consumption, and be arranged in a smaller area on a semiconductor chip compared with bipolar transistors. Also, they are easy to produce. Bipolar transistors are used in the peripheral circuits to permit high speed operation. In the peripheral circuits, bipolar transistors are operated by applying inputs to the bases of the bipolar transistors, and outputs can be taken out either from the collectors or emitters of the transistors. As a result, there is an increase in the design freedom, and designing is thereby made easier.

Figure 1:
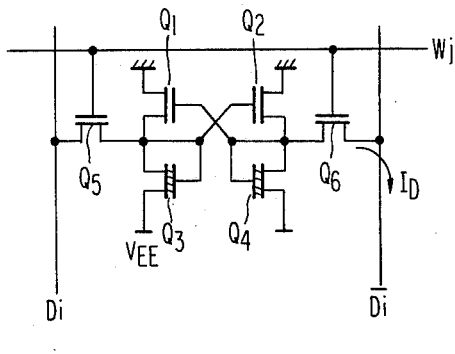
FIG. 1 is a circuit diagram showing a known flip-flop type memory cell using P-Ch MIS transistors.

The present invention will be explained in detail by referring to the drawings.

Figure 2:
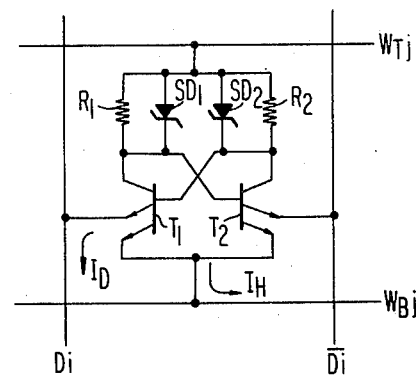
FIG. 2 is a circuit diagram showing a known flip-flop type memory cell using bipolar transistor.

A memory cell employing IGFETs shown in FIG. 1 and a memory cell employing bipolar transistors shown in FIG. 2 have been widely known. In FIG. 1, gates and drains of P-channel IGFETs $Q_1$ and $Q_2$ are cross-coupled, while their sources are grounded. The drains of IGFETs and $Q_1$ and $Q_2$ are coupled to the negative power source $V_{EE}$ through depletion type load P-channel IGFETs $Q_3$ and $Q_4$ and to digit lines $D_i$ and $\overline{D_i}$ through P-channel IGFETs $Q_5$ and $Q_6$. The gates of the transistors $Q_3$ and $Q_6$ are connected to a word line $W_j$.

Because the basic characteristic of an IGFET resides in a voltage amplification operation, IGFETs $Q_3$ and $Q_4$ can be small only to compensate for the leak current of the transistors $Q_1$ and $Q_2$. The read current flowing into the digit line $D_i$ or $\overline{D_i}$ from the memory cell is caused by the conduction resistance of IGFETs $Q_1$ and $Q_5$, or $Q_2$ and $Q_6$ and is not greatly affected by the scale of the memory capacity or power consumption.

In FIG. 2, the memory cell comprising multi-emitter transistors $T_1$ and $T_2$ having cross-coupled bases and collectors, and emitters which connect to the world line $W_{Bj}$. The collectors are connected to the word line $W_{Tj}$ through load resistors $R_1$ and $R_2$. Other emitters of the transistors $T_1$ and $T_2$ are connected to the digit lines $D_i$ and $\overline{D_i}$ respectively. It is necessary to supply a base current of $I_D/(1+h_{FE})$ to cause a read current $I_D$ to flow digit line $D_i$ when the transistor $T_1$ is conducting. "$h_{FE}$" is a current amplification factor of the bipolar transistor. The current is regulated by the load resistors $R_1$ of the flip-flop, and the voltage drop $R_1I_D/(1+h_{FE})$ of the load resistor is limited by the forward voltage $V_D$ of Schottky barrier diodes $SD_1$, $SD_2$ which are arranged in parallel with the load resistors $R_1$ and $R_2$. Therefore, the amount of base current is limited by this limitation level. The holding current $I_H$ of the memory cells and load resistor $R_1$ have a relationship expressed by $RI_H \approx 300$ mV, and the following relationship is established between the holding current $I_H$ and the read current $I_D$:

$$I_D/(1+h_{FE}) \approx I_D/h_{FE} < I_H \sim 2I_H \qquad (1)$$

The holding current $I_H$ becomes smaller the larger the bit capacity. Its typical level is about 50 μA and 10 μA for 1024 bit and 4096 bit memories, respectively. Consequently, assuming the current amplification factor $h_{FE}$ to be 20 which is allowed in terms of practical manufacturing process, the read current will be (50 μA ~ 100 μA)×20=1 mA ~ 2 mA for the 1024 bit memory, while the read current $I_D$ will be 200 μA ~ 400 μA for the 4096 bit memory. Applying a similar calculation for 16 kbit memory $I_D \approx 60$ μA ~ 120 μA with $I_H \approx 3$ μA will be obtained. Therefore, the memory cell employing bipolar transistors shown in FIG. 2 will have a smaller read current the larger the bit capacity, proving that it is not suitable for a large capacity. Therefore, it will be advantageous to form the memory cell array sharing a large area on a semiconductor chip with IGFETs which have a shorter manufacturing process compared with that for bipolar transistors.

Figure 3:
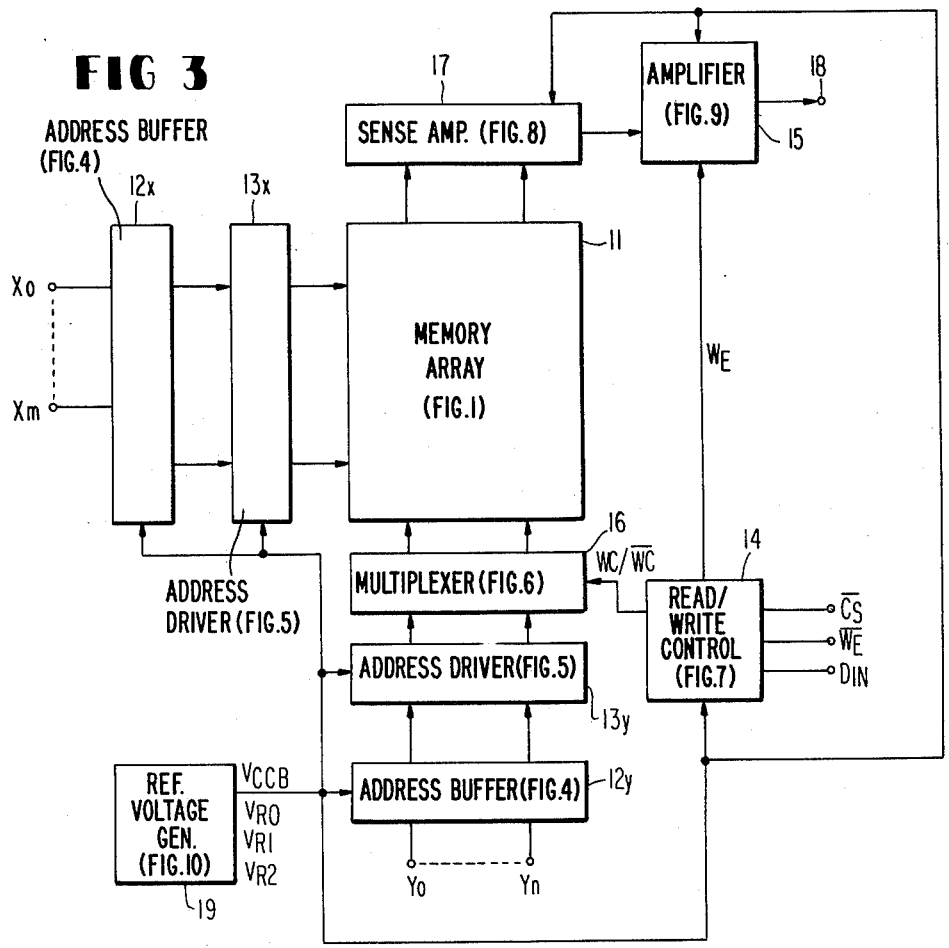
FIG. 3 is a circuit diagram showing a semiconductor memory device according to a preferred embodiment of the present invention.
Figure 4:
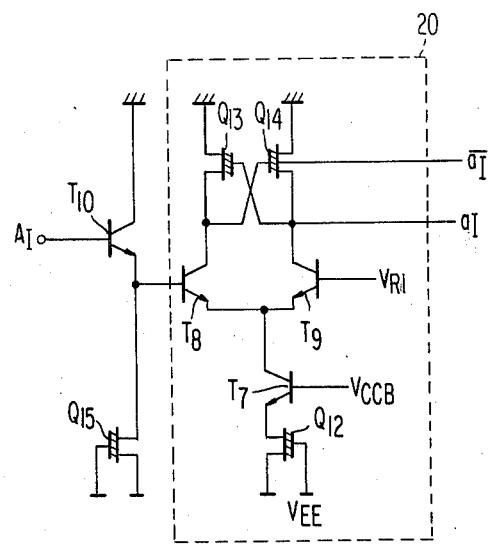
FIG. 4 is a circuit diagram showing an address buffer circuit in FIG. 3.
Figure 5:
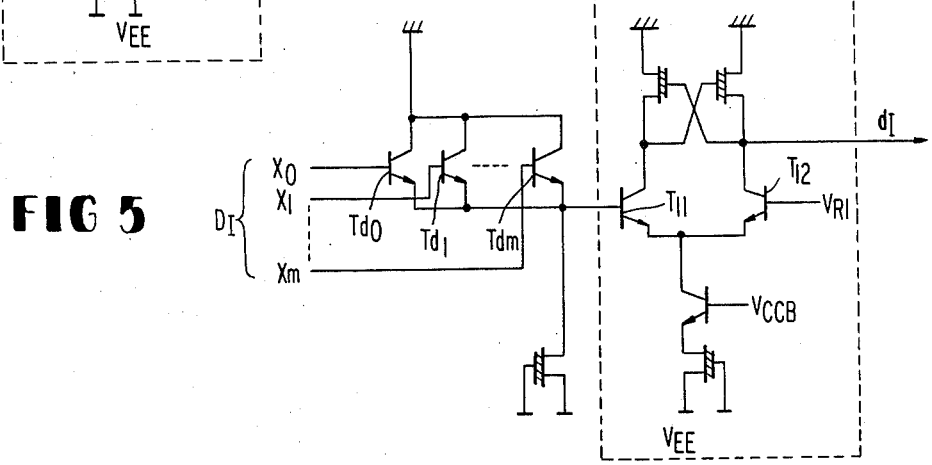
FIG. 5 shows a circuit diagram showing an example of an address decoder and driver circuit in FIG. 3.
Figure 7:
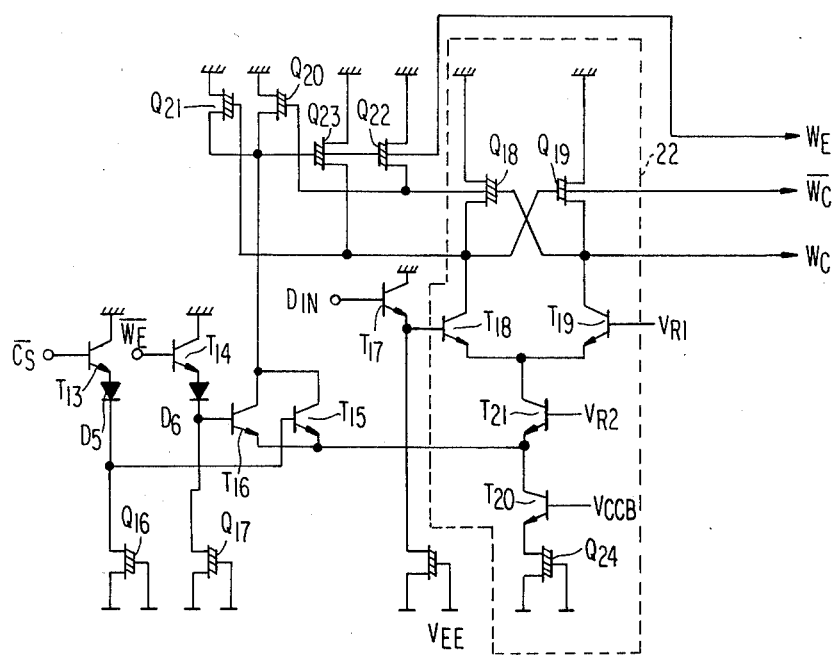
FIG. 7 is a circuit diagram showing an example of the read/write control circuit 14 in FIG. 3.

With reference to FIG. 3, a semiconductor memory device according to the present invention will be described in detail. The memory cell array 11 has memory cells made of IGFETs as shown in FIG. 1. This memory cell array 11 has a matrix structure of j rows by i columns (i×j bits). In connection with FIG. 1, wherein P-channel IGFETs are employed, N-channel IGFETs or complementary type IGFETs (so-called CMOS's) can be employed in place of the P-channel IGFETs. An X-address buffer circuit $12_x$ receives X address inputs $X_0 \sim X_m$. A Y-address buffer circuit $12_y$ receives Y address inputs $Y_0 \sim Y_n$. The address buffer circuit $12_x$ and $12_y$ consist of both IGFETs and bipolar transistors, and their representative circuits are shown in FIG. 4. The outputs of the address buffer circuits $12_x$ and $12_y$ are respectively supplied to address driver circuits $13_x$ and $13_y$. Outputs of the driver circuit $13_x$ drive the word lines of the memory cell array 11 and outputs of the driver circuit $13_y$ control a multiplexer 16. A representative example of these address driver circuits $13_x$ or $13_y$ is shown in FIG. 5 per one bit. There are arranged $2^m = j$ pieces of the circuits shown in FIG. 5 in the driver circuit $13_x$, and $2^n = i$ pieces of the circuits in the driver circuit $13_y$ to select one of the memory cells. Read/write control circuit 14 (in FIG. 3) receives a chip select signal $\overline{C_s}$, write enable signal $\overline{W_E}$, and data $D_{IN}$ from outside and sends a control signal $W_c/\overline{W_c}$ to the multiplexer circuit 16, and signal $W_E$ complementary in phase to the write enable signal $\overline{W_E}$ to an output amplifier circuit 15, respectively. This circuit 14 is shown in FIG. 7.

Figure 6:
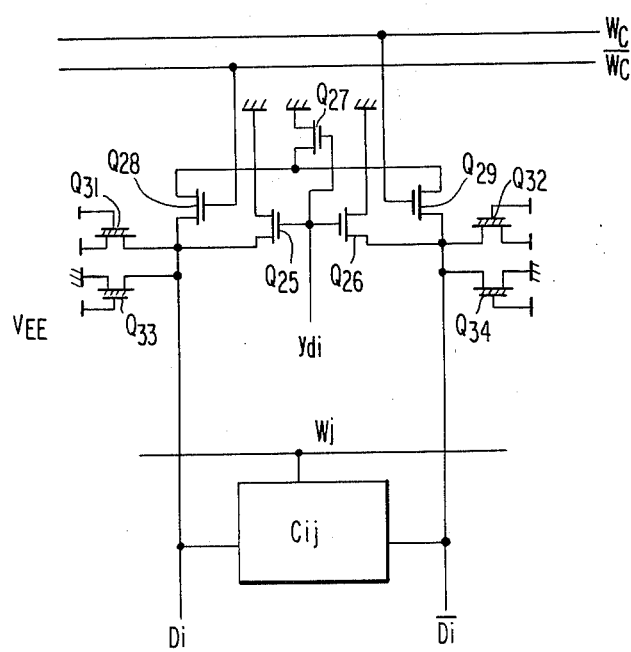
FIG. 6 is a circuit diagram showing an example of the multiplexer circuit 16 in FIG. 3.
Figure 8:
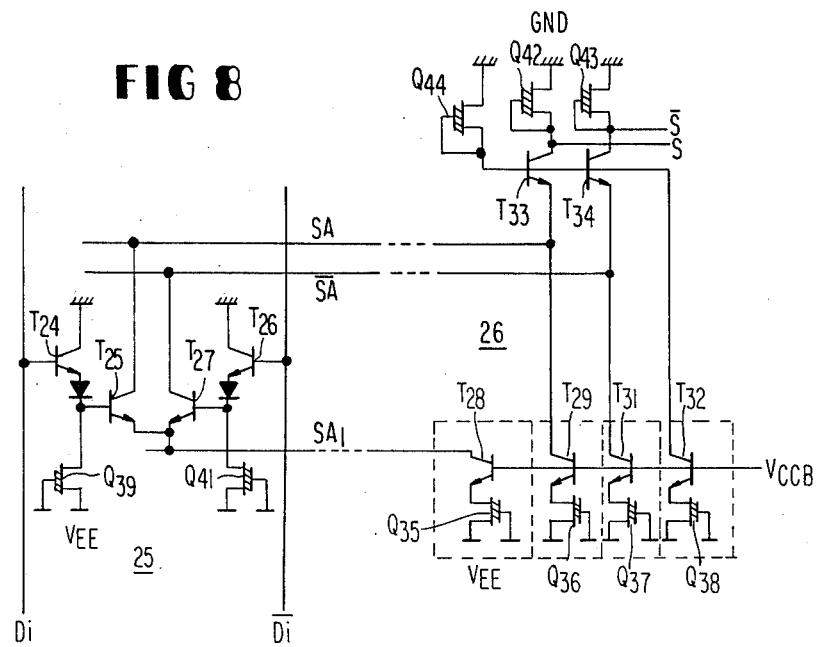
FIG. 8 is a circuit diagram showing an example of the differential amplifier 17 in FIG. 3.
Figure 9:
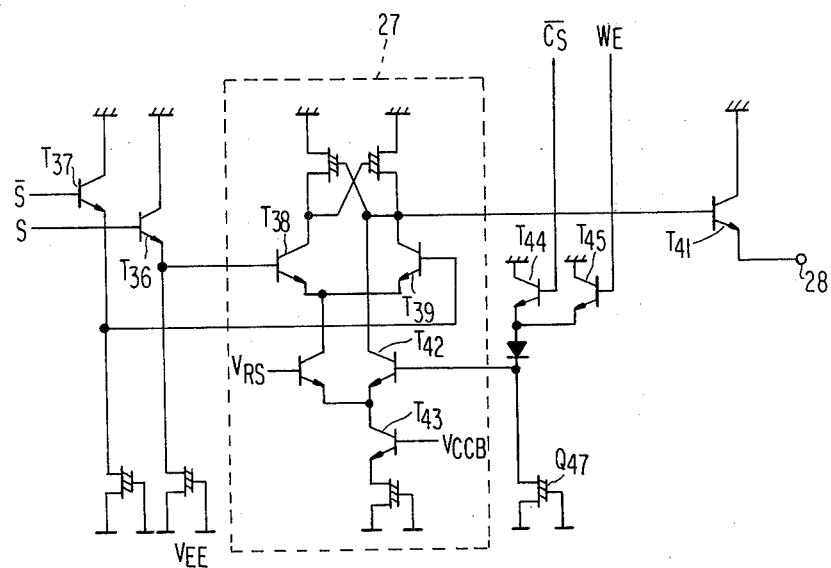
FIG. 9 is a circuit diagram showing an example of the output sense amplifier circuit 15 in FIG. 3.

The multiplexer circuit 16 receives the output of the address driver circuit $13_y$ and the control signal $W_c/\overline{W_c}$ of the read and write control circuit 14 and receives read data or sends write data to a digit line pair to be selected among i pairs of digit lines. The multiplexer circuit 16 for instance, can be constructed as shown in FIG. 6. A differential sense amplifier 17 is provided for each digit line pair of the memory cell array 11, by which read out data of one digit line pair selected is amplified. As an example, these differential amplifiers 17 can be structured as shown in FIG. 8. The read out data amplified by the differential amplifiers 17 are converted into output levels ultimately desired in the output amplifier circuit 15 and are sent to the output terminal 18. The circuit 15 can be, for instance, constructed as shown in FIG. 9.

Figure 10:
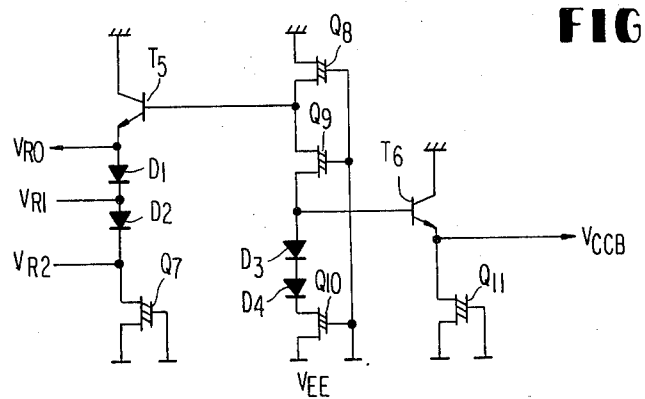
FIG. 10 shows a circuit diagram of an example of the reference voltage generator circuit 19 in FIG. 3.

The reference voltages to operate the circuits $12_x$, $12_y$, $13_x$, $13_y$, and 14 through 17 of these peripheral circuits are generated by a reference voltage generator circuit 19, which can be constructed, for instance, as shown in FIG. 10.

Below, each circuit referred to above will be explained in more detail. For the sake of making the explanation easier, an emitter coupled logic (referred to as ECL in the following) level will be assumed for interface. For this reason, the highest potential of the power supply is 0 V, and the lowest potential is $-5.2$ V, which is designated $V_{EE}$. The input and output levels are $-0.8$ and $-1.8$ V for the high and low levels, respectively. The present invention, however, can be applied to processing on the so-called TTL level.

Referring to FIG. 10, the reference voltage generator circuit 19 will be explained first. A reference voltage $V_{CCB}$ used for a regulated current source and reference voltages $V_{R0}$, $V_{R1}$, and $V_{R2}$ needed for the ECL circuits are generated by this circuit 19. The collector of the bipolar transistor $T_5$ is grounded, and its emitter is connected to one end of a depletion type IGFET $Q_7$ through serially connected diodes $D_1$ and $D_2$. The other end and gate of IGFET $Q_7$ are connected to the low potential $V_{EE}$. Voltages $V_{R0}$, $V_{R1}$, and $V_{R2}$ are obtained from the emitter of the transistor $T_5$, from the junction point of the diodes $D_1$ and $D_2$, and from the junction point of the diode $D_2$ and IGFET $Q_7$, respectively. One end of a depletion type IGFET $Q_8$ is grounded, while the other end is connected to the low potential $V_{EE}$ through a depletion type IGFET $Q_9$-diodes $D_3$-$D_4$ and depletion type IGFET $Q_{10}$. The gates of IGFETs $Q_8$, $Q_9$, and $Q_{10}$, are connected to the low potential $V_{EE}$. The junction point of IGFETs $Q_8$ and $Q_9$ is connected to the base of the transistor $T_5$. The junction point of the transistor $Q_9$ and diode $D_3$ is connected to the base of the bipolar transistor $T_6$ to derive the voltage $V_{CCB}$ from the emitter of the transistor $T_6$, which is connected to the low potential through a depletion type IGFET $Q_{11}$. In this connection, the transistor $T_7$ in the circuit shown in FIG. 4, for example, may be deleted so that the reference voltage $V_{CCB}$ may be omitted from the generator circuit of FIG. 10.

The reference voltage $V_{R0}$ is a used as a reference voltage for the ECL level, and generally takes a value of $-1290$ mV. And hence if a forward voltage of the diodes $D_1$ and $D_2$ is assumed to be 800 mV, the reference voltages $V_{R1}$ and $V_{R2}$ becomes $V_{R1} = -1290$ mV $-800$ mV $= -2090$ mV and $V_{R2} = -2090$ mV $-800$ mV $= -2890$ mV. IGFETs $Q_7$ through $Q_{11}$ used in this circuit 19 having hatched gate sections are depletion type IGFETs and may be considered merely as resistors. Those without hatching in the gate sections are enhancement type IGFETs. By appropriately designing each conduction resistance value of IGFETs $Q_8$, $Q_9$, and $Q_{10}$, in well known manner, voltages of $-1290$ mV $+800$ mV $= -490$ mV and about 400 mV can be generated at the base of the transistor $T_5$ and between the source and drain of IGFET $Q_{10}$, respectively. As a result, the reference voltage $V_{CCB}$ takes a value that is higher than the voltage $V_{EE}$ by the value of 400 mV $+800$ mV $= 1200$ mV assuming the forward voltages of the diodes $D_3$ and $D_4$ and a base-emitter voltage of the transistor $T_6$ to be 800 mV.

FIG. 4 shows the circuit 12 corresponding to one of the address buffer circuits $12_x$ and $12_y$. The bipolar transistors $T_8$ and $T_9$ form ECL 20. ECL 20 differs from ordinary ECLs in that gates and drains of the P-channel IGFETs $Q_{13}$ and $Q_{14}$ are cross-coupled as load elements of the transistors $T_8$ and $T_9$. By selecting the threshold voltages of IGFETs $Q_{13}$ and $Q_{14}$ at about $+0.2 \sim +0.5$ V, the transistor $T_8$ conducts when the address input $A_I$ (either one of $X_o \sim X_m$, or $Y_o \sim Y_n$) applied to the base of the transistor $T_8$ through an emitter follower transistor $T_{10}$ is at a high level, to cause a current to flow from the transistor $Q_{13}$. For this reason, the drain potential of IGFET $Q_{13}$ lowers from 0 V to a specific potential. The gate potential of IGFET $Q_{14}$ also lowers at the same time, and conduction resistance of this transistor $Q_{14}$ becomes small, to accelerate the rise in the collector potential of the transistor $T_9$. The gate potential of IGFET $Q_{13}$ rises to 0 V at this time so that the conduction resistance of IGFET $Q_{13}$ increases. Therefore, the power consumption is reduced. Outputs $a_I$ and $\overline{a_I}$ are led out from the collectors of the transistors $T_9$ and $T_8$. The amplitude levels required for them depend on the respective circuitry designs. In this case, $-1$ to $-2$ V is generally considered sufficient. Therefore, by appropriately setting the conduction resistances of IGFET $Q_{12}$, $Q_{13}$ and $Q_{14}$ to obtain gate voltages of $-1$ to $-2$ V, the required amplitudes can be obtained easily. As address input $A_I$, the X side has $X_o \sim X_m$, and the Y side, $Y_o \sim Y_n$, and outputs $X_m$, $\overline{X_m}$ ($m=o \sim m$) and $Y_n$, $\overline{Y_n}$ ($n=o \sim n$) in in-phase and antiphase are generated as $a_I$ and $\overline{a_I}$. The IGFET $Q_{15}$ operates as load element of the emitter follower transistor $T_{10}$.

The address driver circuits $13_x$ and $13_y$ shown in FIG. 5 have the same structure. Therefore, the circuit 13 and one of its outputs will be explained by referring to FIG. 5. The outputs $X_o \sim X_m$ of the address buffer circuit 12 are selectively supplied to bases of the transistors $Td_o \sim Td_m$ which perform as an emitter follower type OR gate. These transistors $Td_o \sim Td_m$ perform a decoder operation. Consequently, $2^m = j$ circuits corresponding to that of FIG. 5 are provided in the address driver circuit $13_x$. Receiving various combinations of address signals $x_m$, $\overline{x_m}$ ($m=0 \sim m$), a voltage that will become a selective level will be generated for only one word line out of j word lines, generating voltages that will become non-selective levels for all the other word lines. In other words, voltages are generated so that only one output will have $-1$ to $-2$ volt among j outputs $d_I$ while all the other wires will have 0 V. The decode outputs from the commonly coupled emitters of the transistors $Td_o \sim Td_m$ are supplied to the base of one bipolar transistor $T_{11}$ in ECL circuit 21, which has the same configuration as that for the ECL circuit 20 shown in FIG. 4, while output $d_I$ is led from the collector of the other bipolar transistor $T_{12}$.

In the read and write control circuit 14, the chip select signal $\overline{C_S}$ and write enable signal $\overline{W_E}$ are supplied to the bases of the bipolar transistors $T_{13}$ and $T_{14}$ as shown in FIG. 7. The collectors of the transistors $T_{13}$ and $T_{14}$ are grounded, and their emitters are connected to the low potential $V_{EE}$ through the diodes $D_5$ and $D_6$ and IGFETs $Q_{16}$ and $Q_{17}$. The junction points of the diode $D_5$ and IGFET $Q_{16}$ and the diode $D_6$ and IGFET $Q_{17}$ are coupled to the bases of the bipolar transistors $T_{15}$ and $T_{16}$, respectively. The input data signal $D_{IN}$ is supplied to the base of the bipolar transistor $T_{18}$ as one input of the ECL circuit 22 through an emitter-followered bipolar transistor $T_{17}$. The ECL circuit 22 is nearly identical to the ECL circuit 20 shown in FIG. 4 except that a bipolar transistor $T_{21}$ is inserted in a forward direction between the commonly coupled emitter of the bipolar transistors $T_{18}$ and $T_{19}$ and the collector of the transistor $T_{20}$. The emitter of the transistor $T_{21}$ is coupled to the emitter of the transistors $T_{15}$ and $T_{16}$. Read and write control signals $\overline{W_c}$ and $W_c$ are derived from the collectors of the transistors $T_{18}$ and $T_{19}$ in the ECL 22. The collectors of the transistors $T_{15}$ and $T_{16}$ are commonly coupled to ground potential through IGFETs $Q_{20}$ and $Q_{21}$, whose gates are connected to the gates of IGFETs $Q_{18}$ and $Q_{19}$ as load elements in the ECL circuit 22, respectively. The gates of IGFETs $Q_{18}$ and $Q_{19}$ are also grounded through IGFETs $Q_{22}$ and $Q_{23}$. The gates of the transistors $Q_{22}$ and $Q_{23}$ are commonly coupled to the collector of the transistors $T_{15}$ and $T_{16}$, from which signal $W_E$ in reverse phase of the write enable signal $\overline{W_E}$ is led. A table of truth values for this circuit is shown below:

| Function | $\overline{C_S}$ | $\overline{W_E}$ | $D_{IN}$ | $W_E$ | $W_C$ | $\overline{W_C}$ | $D_{OUT}$ |
|---|---|---|---|---|---|---|---|
| Non-selection | $H_i$ | X | X | $-1V \sim -2V$ | 0V | 0V | $L_o$ |
| Writing "$H_i$" | $L_o$ | $L_o$ | $H_i$ | 0V | 0V | $-1V \sim -2V$ | $L_o$ |
| Writing "$L_o$" | $L_o$ | $L_o$ | $L_o$ | 0V | $-1V \sim -2V$ | 0V | $L_o$ |
| Read | $L_o$ | $H_i$ | X | $-1V \sim -2V$ | 0V | 0V | $L_o/H_i$ |

$H_i$: High Level
$L_o$: Low Level
X: Any one of $H_i$ or $L_o$

The signal $W_E$ is at a low level during writing. The read and write control signals $W_c$ and $\overline{W_c}$ are generated by the circuit operation mentioned below. First, when the chip select signal $C_S$ is at a high level, the transistors $T_{18}$, $T_{19}$, and $T_{21}$ become non-conductive regardless of the write enable signal $\overline{W_E}$ or data-in signal $D_{IN}$, and the transistor $T_{16}$ becomes conductive. For this reason, a current of the regulated power supply consisting of the transistors $T_{20}$ and $Q_{24}$ flows from the transistors $Q_{20}$ and $Q_{21}$. The drain potentials of IGFETs $Q_{20}$ and $Q_{21}$, that is, signal $W_E$, become potentials of a low level ($-1 \sim -2$ V). IGFETs $Q_{22}$ and $Q_{23}$ are enhancement-type transistors, and their threshold voltages are in a range of $-0.3$ to $-0.6$ V and conduct when the voltage of $-1 \sim -2$ V is applied to their gates, so that both the read and write signals $W_c$ and $\overline{W_c}$ are made 0 V. The signals $W_C$ and $\overline{W_C}$ become 0 V even when the write enable signal $\overline{W_E}$ is at the high level, as is the case when the chip select signal is at a high level. As the transistor $T_{21}$ is not conducting, the signal $D_{IN}$ does not affect the levels of the signals $W_C$ and $\overline{W_C}$. This state is a read state. As will be stated later, the output will be at a low level if the chip select signal $\overline{C_S}$ is at a high level at the same time, and the semiconductor memory chip will be in a non-selective state. If the signals $\overline{C_S}$ and $\overline{W_E}$ are both at a low level, then the transistor $T_{21}$ conducts, and the read and write control signals $W_C$ and $\overline{W_C}$ become differential signals of 0 V and $-1$ to $-2$ V by the level of the data-in signal $D_{IN}$. Needless to say, the gate potentials of IGFETs $Q_{22}$ and $Q_{23}$ will accurately be 0 V as the low level of $-1$ to $-2$ V is applied to the gate of either one of IGFETs $Q_{20}$ and $Q_{21}$. The transistors $T_{13}$ and $T_{14}$ and diodes $D_5$ and $D_6$ are used merely for level adjustment, and IGFETs $Q_{16}$, $Q_{17}$, etc. operate as load elements of the emitter follower circuits as stated above.

The multiplexer 16 shown in FIG. 6 determines one digit line pair among i pairs of digit lines in the memory cell array 11 in accordance with the output $Y_{di}$ of the address driver circuit $13_y$. Only one of $Y_{di}(i=1\sim i)$ selected has the low level of $-1$ to $-2$ V, and all the others have 0 V. The output signals $Y_{di}$ are given to the gates of the IGFETs $Q_{25}$, $Q_{26}$, and $Q_{27}$. The drains of IGFETs $Q_{28}$ and $Q_{29}$ are coupled to the source of IGFET $Q_{27}$. The source of IGFETs $Q_{28}$ and $Q_{29}$ are coupled to the digit lines $D_i$ and $\overline{D_i}$, respectively and the gates thereof are supplied with the control signals $\overline{W_C}$ and $W_C$. The sources of IGFETs $Q_{25}$ and $Q_{26}$ are coupled to the digit lines $D_i$ and $\overline{D_i}$, and the drains thereof are grounded. The digit line $D_i$ is connected to a low potential point and the ground through IGFETs $Q_{31}$ and $Q_{33}$, respectively. The digit line $\overline{D_i}$ connects to a low potential point and the ground through IGFETs $Q_{32}$ and $Q_{34}$, respectively.

When the read out state is considered, IGFETs $Q_{28}$ and $Q_{29}$ are in a non-conductive state and the potentials of i-1 non-selective pairs of digit lines can be shown approximately by the following provided that IGFETs $Q_{25}$ and $Q_{26}$ are non-conducting:

$$V_{\overline{Di}} = V_{EE} \times r_{34}/(r_{32}+r_{34}), l=i \quad (2)$$

$$V_{Di} = V_{EE} \times \{r_{33}//(r_{QC}+r_{QT})\}/\{[r_{33}//(r_{QC}+r_{QT})]+r_{31}\}, l \neq i \quad (3)$$

Wherein conductive resistances of IGFETs $Q_{25}$ through $Q_{34}$ are represented by $r_{25} \sim r_{34}$, respectively and the impedance of the digit line $D_i$ on the conducting side of the memory cell $C_{ij}$ is assumed to be $r_{QC}+r_{QT}$, and the digit line on the non-conducting side of the transistor of the memory cell $C_{ij}$ is assumed to be $\overline{D_i}$. IGFETs $Q_{25}$ and $Q_{26}$ conduct, and the potential of the selected digit line pair will be:

$$V_{\overline{Di}} = V_{EE} \times (r_{26}//r_{34})/\{(r_{26}//r_{36})+r_{32}\} \quad (4)$$

$$V_{Di} = -V_{EE}\{(r_{QC}+r_{QT})//r_{25}//r_{33}\}/\{(r_{QC}+r_{QT})//r_{25}//r_{33})+r_{31}\} \quad (5)$$

When the symmetry of the circuit is considered: $r_{25}=r_{26}$, $r_{31}=r_{32}$ and $r_{33}=r_{34}$. Let us assume further $r_{25}=r_{31}=r_{33}=r_{QC}+r_{QT}$ for the sake of explaining the circuitry operation better. Then, Eqs. (2), (3), (4) and (5) will be $V_{\overline{Di}}=V_{EE}\times\frac{1}{2}$, $V_{\overline{Di}}=V_{EE}\times\frac{1}{3}$, and $V_{Di}=V_{EE}\times\frac{1}{4}$. Therefore, assuming the low potential $V_{EE}$ to be $-5.2$ V, the potential of the nonselective digit line will be $V_{\overline{Di}}=-2.6$ V and $V_{\overline{Di}}=-1.7$ V, and the potential of the digit lines in the digit line pair to be selected will be $V_{Di}=-1.7$ V and $V_{Di}=1.3$ V. Therefore, the contents of the selected memory cell can be read by detecting the differential potential of this digit line pair by the differential amplifier 17. A further explanation of this is omitted as it will be taken up when the differential amplifier 17 is explained in the following section.

Differential signals of 0 V and $-1$ to $-2$ V are generated on the write control signal $W_C$ and $\overline{W_C}$ to write information in the selected memory cell $C_{ij}$. As the decoder outputs $Y_{dl}(l \neq i)$ on the Y side to be supplied to non-selective digit wire pairs are all 0 V, IGFET $Q_{27}$ becomes non-conductive and the digit line pairs are not affected no matter what voltages may be applied to the gates of the IGFETs $Q_{28}$ and $Q_{29}$. While, the digit lines of only one digit line pair selected will have a differential signal according to the $D_{IN}$ input signal in response to the conducting state of IGFETs $Q_{28}$ and $Q_{29}$ which receive the signals $W_C$ and $\overline{W_C}$ as IGFET $Q_{27}$ conducts. In this instance, by making the conductive resistance of IGFETs $Q_{27}$, $Q_{28}$, and $Q_{29}$ sufficiently smaller than that of IGFET $Q_{31}$, etc., the potential of the digit line coupled to conducted one of IGFETs $Q_{28}$ and $Q_{29}$ becomes 0 V. Therefore, the potential of this digit line is applied to the gates of IGFET $Q_1$ and $Q_2$ of the memory cell through the transfer gates $Q_5$ and $Q_6$ (FIG. 1) in the memory cell $C_{ij}$ so that the content of this memory cell can be reversed.

The differential amplifier 17 shown in FIG. 8 detects and amplifies the differential potential of the digit line pair. The differential amplifier 25 includes bipolar transistors $T_{24}$, $T_{25}$, $T_{26}$, and $T_{27}$ which are current-amplification connected. Digit lines $D_i$ and $\overline{D_i}$ are coupled to the bases of the transistors $T_{24}$ and $T_{26}$, which are two inputs for the differential amplifier 25 respectively. The collectors of the transistors $T_{25}$ and $T_{27}$, from which outputs of the differential amplifier 25 are derived, are coupled to sense lines SA and $\overline{SA}$, respectively. The emitters of the transistors $T_{25}$ and $T_{27}$ are coupled to the low potential $V_{EE}$ through a line $SA_1$ and a regulated power supply circuit made of transistors $T_{28}$ and $Q_{35}$. The bases of the transistors $T_{25}$ and $T_{27}$ are coupled to the low potential $V_{EE}$ through IGFETs $Q_{39}$ and $Q_{41}$ acting as resistance elements, respectively. The sense lines SA and $\overline{SA}$ are coupled to the emitters of the transistors $T_{33}$ and $T_{34}$ in the detection circuit 26, respectively, and to the low potential $V_{EE}$ through regulated power supply circuits made of the transistors ($T_{29}$, $Q_{36}$), and ($T_{31}$, $Q_{37}$) respectively. The collectors of the transistors $T_{33}$ and $T_{34}$ are coupled to the ground through IGFETs $Q_{44}$ and coupled to the low potential $V_{EE}$ through a regulated current source made of the transistors $T_{32}$ and $Q_{38}$. The transistors $T_{33}$ and $T_{34}$ constitute a base-grounded type impedance conversion circuit which reduces effects of the capacities of the sense lines SA and $\overline{SA}$.

The potentials generated on one digit line pair becomes $-2.6$ V ($\frac{1}{2}$ $V_{EE}$) and $-1.73$ V ($\frac{1}{3}$ $V_{EE}$) on a non-selective digit line pair and $-1.73$ ($\frac{1}{3}$ $V_{EE}$) and $-1.3$ V ($\frac{1}{4}$ $V_{EE}$) on a selected digit line pair, as stated in the explanation for the multiplexer 16. For this reason, the commonly coupled emitters of all of the i pieces of differential amplifiers 16 are commonly coupled to a regulated power supply made of the transistors $T_{28}$ and $Q_{35}$. As a result, the transistor that has the highest input level of the differential amplifier 17 conducts, conducting only the transistor applied with $-1.3$ V, which is higher one of $-1.73$ V and $-1.3$ V of the potentials of the digit line pair selected.

The potential of the digit line pair detected by the differential amplifier 17 is amplified by the output amplifier circuit 15 in which the output lines S and $\overline{S}$ are supplied to the emitter-followed bipolar transistors $T_{36}$ and $T_{37}$ as shown in FIG. 9. Outputs therefrom are supplied to the bases of the input bipolar transistors $T_{38}$ and $T_{39}$ in the ECL circuit 27 which is similar to the ECL circuit 22 in FIG. 7. The collector of the transistor $T_{39}$ is supplied to the base of the bipolar transistor $T_{41}$, whose collector is grounded and whose emitter supplies output to the terminal 28. The collector of the transistor $T_{39}$ in the ECL circuit 27 is coupled to the collector of the transistor $T_{43}$ as regulated power supply through the transistor $T_{42}$. The chip select signal $\overline{C_S}$ and the signal $W_E$ from the read and write control circuit 14 are supplied to the bases of the transistors $T_{44}$ and $T_{45}$, respectively. The emitters of these transistors $T_{44}$ and $T_{45}$ are commonly coupled to the base of the transistor $T_{42}$ and to the low potential $V_{EE}$ through IGFET $Q_{47}$. Consequently, when the line S from the differential amplifier 17 is at a high level and the output terminal 28 is at a high level. While the terminal 28 is at a low level when the line $\overline{S}$ is at a high level. When logical OR output of the signals $\overline{C_S}$ and $W_E$ is at a high level, the transistor $T_{42}$ conducts, and the output terminal 28 will be at a low level regardless of the read signals from the memory cells.

Next, comparisons of above-described embodiment with a MOS RAM employing only IGFETs and a bipolar RAM employing only bipolar transistors will be shown in case of a memory capacity of one kilobits as an example.

Table 1 shows delay times for each function block shown in FIG. 3 and for total for each case regarding delay time.

TABLE 1

| | Block (Unit: ns) | | | | |
|---|---|---|---|---|---|
| | $12_x$ | $13_x$ | 11 | 17 | 15 | Total |
| Present Invention (ECL interface) | 2 | 3 | 7 | 2 | 2 | 16 |
| MOS RAM (TTL interface) | 3 | 5 | 10 | 5 | 7 | 30 |
| Bipolar RAM (ECL) | 2 | 3 | 5 | 2 | 2 | 14 |

Table 1 shows that a read time of 16 ns, which is substantially equivalent to 14 ns for the bipolar RAM, has been realized by the invention. This means that a high speed equivalent to that of a bipolar RAM can be realized by the invention.

In a similar context, integration will be studied next.

Table 2 shows areas per function block shown in FIG. 3 and total chip areas for the present invention, MOS RAM and bipolar RAM.

TABLE 2

| | Block (Unit: mm²) | | | | | | | | | |
|---|---|---|---|---|---|---|---|---|---|---|
| | 11 | $12_x$ | $13_x$ | $12_y$ | $13_y$ | 16 | 17 | 14 | 19 | Others | Total |
| Present Invention | 2.4 | 0.3 | 0.7 | 0.3 | 0.6 | 0.3 | 0.2 | 0.1 | 0.3 | 1.4 | 6.9 |
| MOS | 2.4 | 0.2 | 0.6 | 0.2 | 0.1 | 0.1 | 0.1 | — | 1.0 | 1.2 | 6.0 |
| RAM | | | | | | | | | | | |
| Bipolar RAM | 5.5 | 0.3 | 0.7 | 0.3 | 0.6 | 0.3 | 0.3 | 0.1 | 0.3 | 2.0 | 10.6 |

The column for "Others" in Table 2 shows regions for bonding pads, etc.

Table 2 shows that the present invention can be realized in a small area nearly the same as that for MOS RAM and that it has a high integration degree.

Above, the effects of the present invention have been explained with an example for a one-kilobit chip. The effects of the present invention, that is, a simultaneous realization of high speed and high integration, will be clearer the larger the capacities of RAMs such as 16 and 64 kilobit RAMs.

I claim:

1. A memory device comprising:
   a plurality of memory cells arrayed in rows and columns, each of said memory cells having a pair of cross-coupled insulated-gate field effect transistors,
   at least one address inverter circuit for generating true and complement signals of an address signal, said address inverter circuit including first and second bipolar transistors having commonly connected emitters, a constant current source coupled to said commonly connected emitters, a first field effect transistor connected between a predetermined voltage and the collector of said first bipolar transistor, a second field effect transistor connected between said predetermined voltage and the collector of said second transistor, means for connecting the gate of said first field effect transistor to the collector of said second bipolar transistor, means for connecting the gate of said second field effect transistor to the collector of said first bipolar transistor, means for supplying the base of said first bipolar transistor with said address signal, and means for supplying the base of said second transistor with a reference voltage, said true and complement signals being derived from the collectors of said second and first bipolar transistors respectively,
   row drive means responsive to the output of said address inverter for selectively energizing one of said rows, said row drive means including an emitter coupled logic circuit, and
   a read circuit for sensing data stored in selected ones of said memory cells, and read circuit including third and fourth bipolar transistors having commonly connected emitters, a constant current source coupled to said commonly connected emitters of said third and fourth bipolar transistors, and means for supplying the bases of said third and fourth bipolar transistors with a differential signal derived from selected memory cell.

2. The memory device according to claim 1, in which said emitter coupled logic circuit included in said row drive means includes a fifth and a sixth bipolar transistors having commonly connected emitters, a constant current source coupled to said commonly connected emitters of said fifth and sixth transistors, a third field effect transistor connected between said predetermined voltage and the collector of said fifth bipolar transistor, a fourth field effect transistor connected between said predetermined voltage and the collector of said sixth bipolar transistor, means for connecting the gate of said third field effe transistor to the collector of said sixth bipolar transistors, means for connecting the gate of said fourth field effect transistor to the collector of said fifth bipolar transistor, means for supplying the base of said sixth bipolar transistor with said reference voltage, and means for supplying the base of said fifth bipolar transistor with a decoded address signal.

3. The memory device according to claim 1, in which said first and second field effect transistors are of the depletion type.

4. A memory device comprising:
  a plurality of memory cells including insulated-gate field effect transistors,
  a selection circuit responsive to address signal for selecting said memory cells, said selection circuit including first and second bipolar transistors having commonly connected emitters, a current source connected to said commonly connected emitters, a first load element including a first field effect transistor connected to the collector of said first bipolar transistor, and a second load element including a second field effect transistor connected to the collector of said second bipolar transistor, said first and second bipolar transistors being driven in a differential manner by said address signal, and
  a sense circuit for detecting stored data of selected memory cells, said sense circuit including third and fourth bipolar transistors having commonly connected emitters, a current source coupled to said commonly connected emitters, a third load element including a third field effect transistor coupled to the collector of said third bipolar transistor, a fourth load element including a fourth field effect transistor coupled to the collector of said fourth bipolar transistor and means for supplying the bases of said third and fourth bipolar transistors with differential signal derived from selected memory cells thereby to operate said third and fourth bipolar transistors as an emitter-coupled logic circuit.

5. The device according to claim 4, in which said first to fourth field effect transistors are of the depletion type.

6. The device according to claim 4, further comprising means for connecting the gate of said third field effect transistor to the collector of said fourth bipolar transistor, and means for connecting the gate of said fourth field effect transistor to the collector of said third bipolar transistor.

7. A semiconductor memory comprising a plurality of memory cells, each of said memory cells including binary storage means and at least one transfer gate composed of an insulated gate field effect transistor, and a peripheral circuit for operatively driving the memory cell from which the stored content is read out, said peripheral circuit including at least one emitter coupled logic circuit, said emitter coupled logic circuit including first and second bipolar transistors having commonly connected emitters, a constant current source coupled to said commonly connected emitters, a first load element of a first field effect transistor coupled to the collector of said first bipolar transistor and a second load element of a second field effect transistor coupled to the collector of said second bipolar transistor.

8. A semiconductor circuit comprising first and second bipolar transistors, the emitters of said first and second transistors being commonly connected, a first voltage terminal, a second voltage terminal, a first field effect transistor connected between said first voltage terminal and the collector of said first bipolar transistor, a second field effect transistor connected between said first voltage terminal and the collector of said second bipolar transistor, a constant current source connected between said second voltage terminal and said emitters of said first and second bipolar transistors, and means for supplying the bases of said first and second bipolar transistors with a pair of signals having different potentials, a pair of output signals being derived from the collectors of said first and second bipolar transistors.

9. The circuit according to claim 8, in which the gate of said first field effect transistor is connected to the collector of said second bipolar transistor and the gate of said second field effect transistor is connected to the collector of said first bipolar transistor.

10. The circuit according to claim 9, in which said first and second field effect transistors are of the depletion type.

* * * * *

UNITED STATES PATENT AND TRADEMARK OFFICE
CERTIFICATE OF CORRECTION

PATENT NO. : 4,335,449
DATED : June 15, 1982
INVENTOR(S) : Nokubo

It is certified that error appears in the above—identified patent and that said Letters Patent is hereby corrected as shown below:

Col. 2, line 67, change "compensate for the leak" to --compensate for the leakage--.

Col. 3, line 7, change "world line" to --word line--;

line 13, change "flow digit line" to --flow in digit line--;

Col. 5, line 1, change "is a used" to --is used as--.

Col. 6, line 58, change "$C_s$" to --$\overline{C}_s$--;

Col. 8, line 3, change "$V_{\overline{D\ell}} = -1.7V$" to --$V_{D\ell} = -1.7V$--;

line 5, change "$V_{Di} = -1.7V$" to --$V_{\overline{Di}} = -1.7V$--.

Signed and Sealed this

Ninth Day of November 1982

[SEAL]

Attest:

GERALD J. MOSSINGHOFF

Attesting Officer   Commissioner of Patents and Trademarks